United States Patent
Scott et al.

(10) Patent No.: US 11,287,160 B2
(45) Date of Patent: Mar. 29, 2022

(54) WATER HEATER INLET FITTING, FLOW SENSOR, SHUT OFF VALVE AND DIFFUSER

(71) Applicant: Rheem Manufacturing Company, Atlanta, GA (US)

(72) Inventors: Timothy D. Scott, Tallassee, AL (US); Michael C. Mitchell, Auburn, AL (US); Raheel A. Chaudhry, Montgomery, AL (US); William T. McLemore, Montgomery, AL (US); Hector J. Donastorg, Auburn, AL (US)

(73) Assignee: Rheem Manufacturing Company, Atlanta, GA (US)

(*) Notice: Subject to any disclaimer, the term of this patent is extended or adjusted under 35 U.S.C. 154(b) by 549 days.

(21) Appl. No.: 16/042,386

(22) Filed: Jul. 23, 2018

(65) Prior Publication Data
US 2019/0024943 A1   Jan. 24, 2019

Related U.S. Application Data

(60) Provisional application No. 62/535,592, filed on Jul. 21, 2017.

(51) Int. Cl.
| | |
|---|---|
| F24H 9/12 | (2006.01) |
| F24H 1/18 | (2022.01) |
| G01R 33/07 | (2006.01) |
| F24H 9/20 | (2022.01) |
| G01F 1/56 | (2006.01) |
| F24H 9/00 | (2022.01) |
| F24H 1/20 | (2022.01) |
| G01R 33/00 | (2006.01) |
| G01F 15/00 | (2006.01) |
| G01F 1/115 | (2006.01) |

(52) U.S. Cl.
CPC .............. *F24H 9/126* (2013.01); *F24H 1/185* (2013.01); *F24H 1/202* (2013.01); *F24H 9/0015* (2013.01); *F24H 9/2021* (2013.01); *G01F 1/56* (2013.01); *G01R 33/0047* (2013.01); *G01R 33/07* (2013.01); *G01R 33/072* (2013.01); *G01F 1/115* (2013.01); *G01F 15/005* (2013.01)

(58) Field of Classification Search
CPC .......... F24H 1/185; F24H 1/02; F24H 9/0015; F24H 9/126; F24H 9/2021; G01F 1/115; G01F 1/56; G01F 15/005; G01R 33/0047; G01R 33/07; G01R 33/072
USPC ...................................................... 122/14.3
See application file for complete search history.

(56) References Cited

U.S. PATENT DOCUMENTS

| | | | | |
|---|---|---|---|---|
| 3,319,980 A | * | 5/1967 | Demetriff | ............... F24H 9/124 |
| | | | | 285/123.3 |
| 5,277,171 A | * | 1/1994 | Lannes | ................. F16K 15/148 |
| | | | | 122/14.31 |
| 9,022,243 B2 | * | 5/2015 | Peteri | ................. F16L 19/0237 |
| | | | | 220/288 |

\* cited by examiner

*Primary Examiner* — Steven B McAllister
*Assistant Examiner* — Benjamin W Johnson
(74) *Attorney, Agent, or Firm* — Troutman Pepper Hamilton Sanders LLP

(57) ABSTRACT

An integrated valve and flow sensor for a water heater can have a valve body that includes a valve and a flow sensor for measuring the flow of water through the valve. The integrated valve and flow sensor can be disposed within a fitting that can be attached to a water heater. An actuator for opening and closing the valve can be attached to the fitting. A diffuser can also be attached to the fitting.

7 Claims, 5 Drawing Sheets

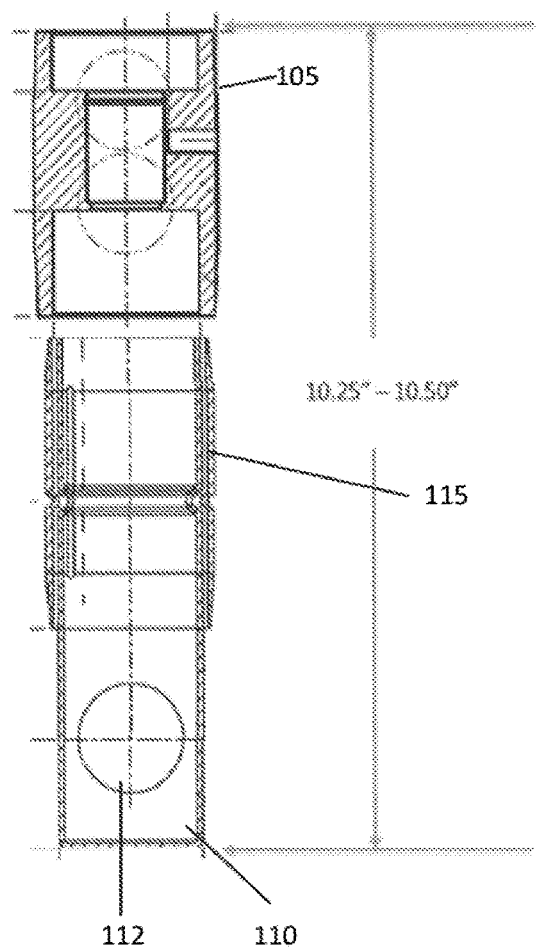
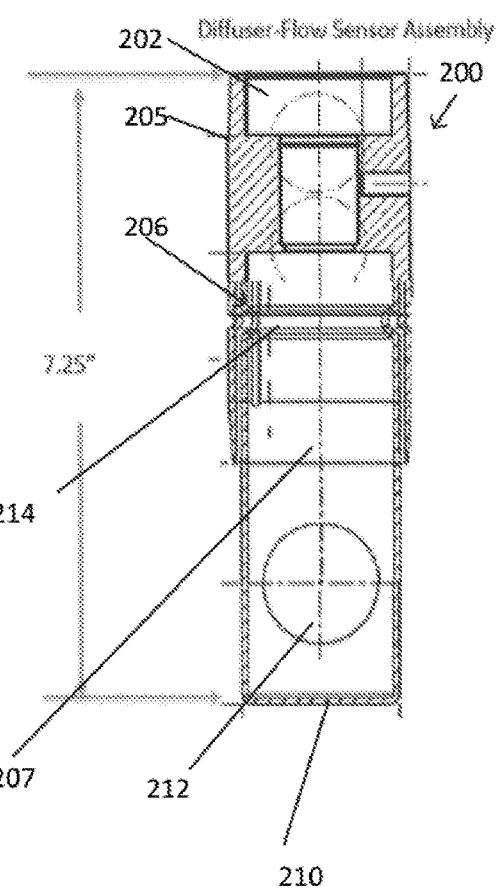
Fig. 1
(prior art)
Fig. 2

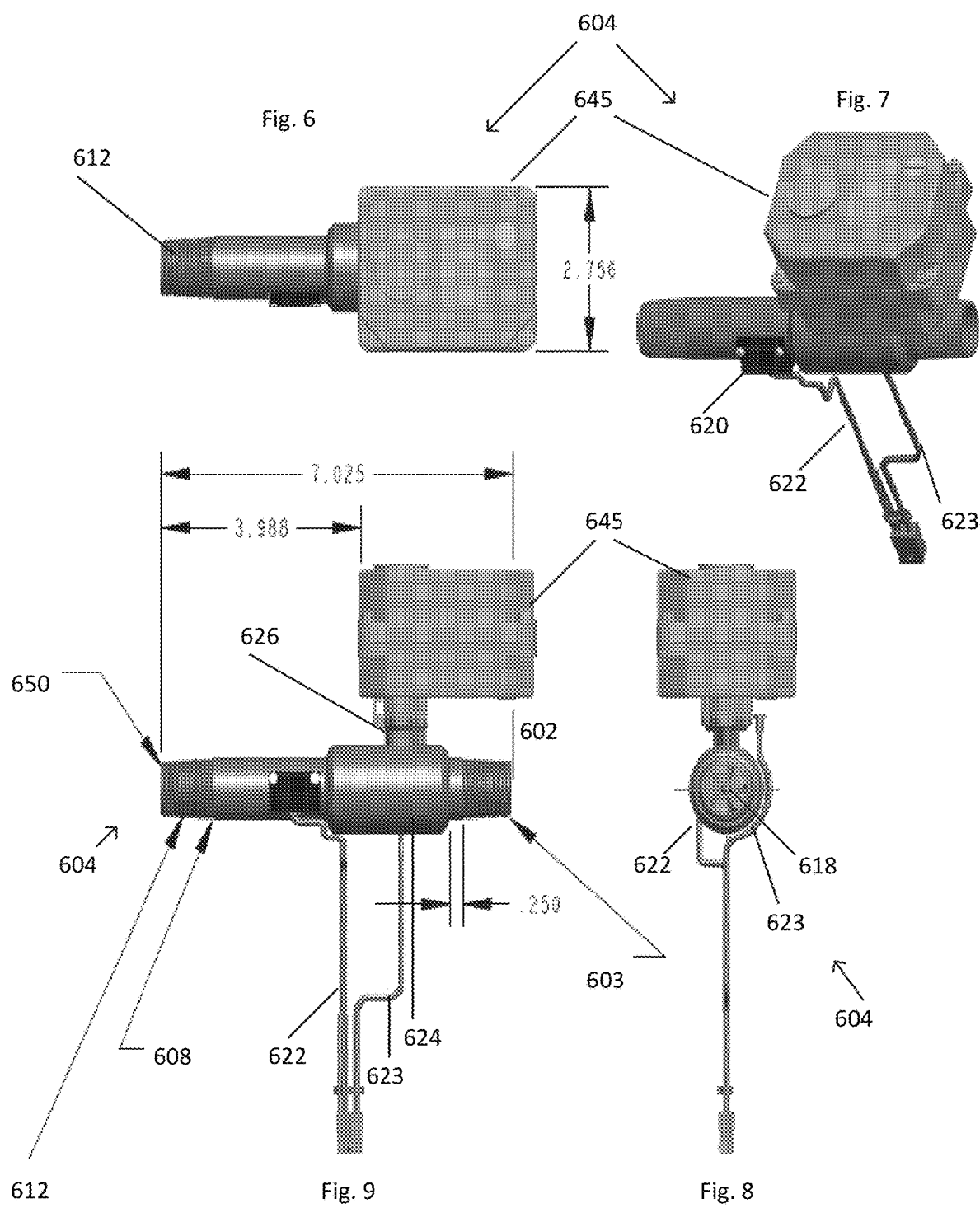

WATER HEATER INLET FITTING, FLOW SENSOR, SHUT OFF VALVE AND DIFFUSER

RELATED APPLICATIONS

The present application claims priority to U.S. Provisional Patent Application No. 62/535,592, filed Jul. 21, 2017, and titled "Water Heater Inlet Fitting, Flow Sensor, Shut Off Valve and Diffuser", the entire contents of which are incorporated herein by reference.

TECHNICAL FIELD

The present disclosure relates generally to water heaters and particularly to water heater inlet fittings.

BACKGROUND

Boilers, water heaters, and other similar devices have various types of water inlet fittings. For example, gas water heaters typically have an inlet with a diffuser that extends into the water heater. The diffuser can be designed and positioned within the water heater to optimize the thermal efficiency of the water heater. The proper orientation and geometry of the diffuser will deliver cold inlet water to the proper location within the water heater allowing mixing and counter-flow and preventing the cold inlet water from being directed at one or more heat exchanger pipes which could cause thermal stress. In one example, the optimum orientation for the diffuser is the 2 o'clock position for the diffuser outlet, assuming the diffuser is positioned extending vertically downward into the cylindrically shaped water heater tank, the diffuser outlet is on a side of the diffuser pointing outward toward a wall of the water heater tank, the 12 o'clock position is pointing inward toward a gas flue running through the central longitudinal axis of the cylindrically shaped water heater tank, and the 6 o'clock position is pointing outward directly towards the closest section of the outer wall of the water heater tank. Because the diffuser is a separate component that must be attached to the gas water heater during installation, there is an increased likelihood the installer may not position the diffuser properly during the installation thereby negatively affecting the thermal efficiency of the water heater. For example, if the diffuser is attached to the water heater and then the separate flow sensor is attached to the diffuser, torque is separately applied to both the diffuser and the flow sensor. When torque is applied to the flow sensor, there is a tendency for the diffuser to shift from the optimal position.

Another drawback in some existing water heaters is the length of the diffuser and the inlet fitting because longer components require more space in which to install the water heater.

Yet another drawback of some existing water heaters is that the inlet fittings lack integrated components for measuring the flow of water through the fitting or shutting off the flow of water through the fitting.

The following disclosure describes example water inlet fittings, flow sensors, shut off valves, and diffusers that can address one or more of the foregoing limitations associated with water heaters and other similar devices.

SUMMARY

The present disclosure is directed to a flow sensor for a water heater. In one embodiment, an integrated flow sensor and diffuser for a water heater include a flow sensor body with a diffuser attachment mechanism and a diffuser with a complementary attachment mechanism. An inlet of the flow sensor body includes an inlet attachment mechanism for attaching the flow sensor body to a water supply pipe. The diffuser attachment mechanism is located on an extended cylindrical flange at an outlet of the flow sensor body. The complementary diffuser attachment mechanism is configured to couple to the diffuser attachment mechanism of the extended cylindrical flange. The flow sensor body includes a cavity for retaining a flow sensor. The integrated flow sensor and diffuser can have a single set of threads on the outer surface of the extended cylindrical flange so that the integrated flow sensor and diffuser can be attached to the water heater as a single assembly.

In another example embodiment, an integrated valve and flow sensor include a valve body, a rotatable ball disposed within the valve body, a flow sensor comprising a Hall effect sensor and a turbine disposed within the rotatable ball, a stem extending from the rotatable ball and comprising a lead from the Hall effect sensor, and an actuator coupled to the stem for controlling the operation of the rotatable ball. The lead from the Hall effect sensor can be coupled to a meter that measures a flow of water through the integrated valve and flow sensor. An outlet of the integrated valve and flow sensor can include an attachment mechanism for mating with a complementary attachment mechanism of a diffuser.

In yet another example, a fitting for a water heater comprises a valve, an actuator coupled to the valve for opening and closing the valve, a flow sensor, and a heat trap. The flow sensor can comprise a turbine and a Hall effect sensor for measuring the flow of water through the fitting. The heat trap can prevent undesirable mixing or loss of heated water. The fitting can be coupled to either an inlet fitting or an outlet fitting on a water heater.

These and other aspects and examples will be described in the following description and the accompanying drawings.

BRIEF DESCRIPTION OF THE DRAWINGS

Reference will now be made to the accompanying drawings, which are not necessarily drawn to scale, and wherein:

FIG. 1 is a cross-sectional illustration of separate flow sensor and diffuser components joined with a coupler as known in the prior art.

FIG. 2 is a cross-sectional illustration of an inlet fitting that is a combined flow sensor and diffuser assembly in accordance with an example embodiment of this disclosure.

FIGS. 6, 7, 8, and 9 are views from different angles of an inlet fitting that is a combined flow sensor and shut off valve in accordance with an example embodiment of this disclosure.

DESCRIPTION OF EXAMPLE EMBODIMENTS

Figure 3:
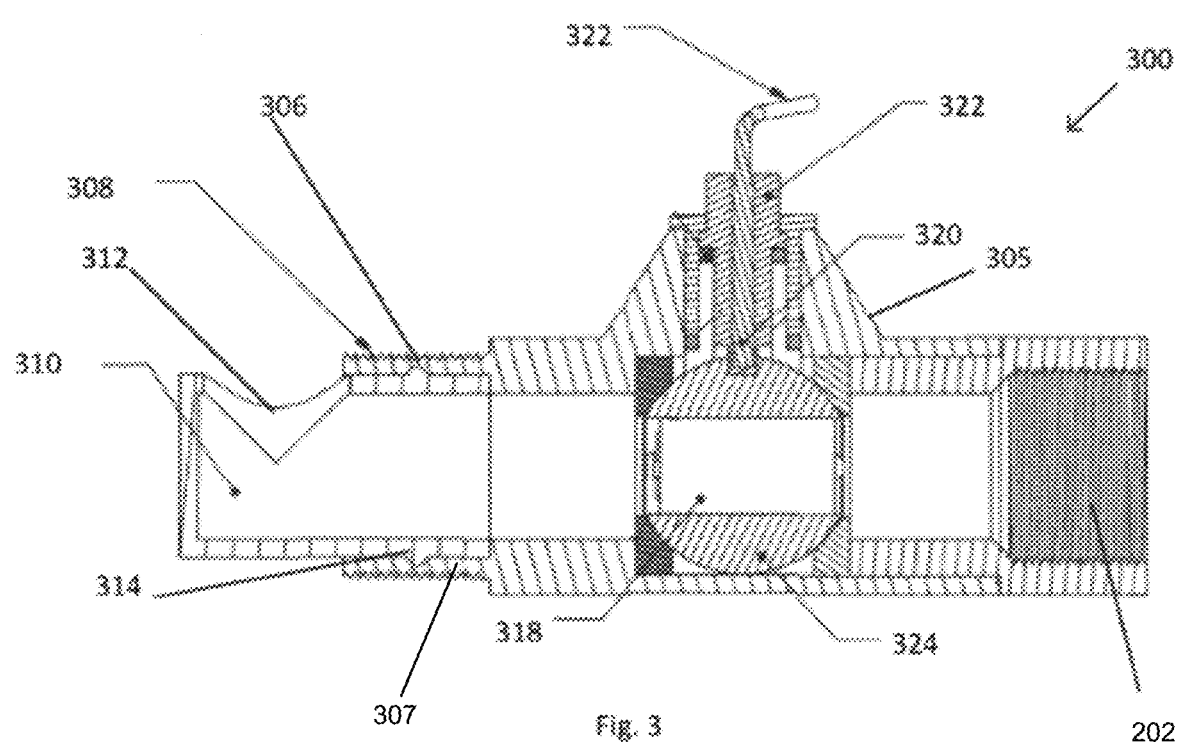
FIG. 3 is a cross-sectional illustration of an inlet fitting that is a combined flow sensor, diffuser, and shut off valve assembly in accordance with an example embodiment of this disclosure.

The example embodiments discussed herein are directed to systems, apparatuses, and methods for water heaters with optimized inlet structures, diffusers, flow sensors and shut off valves. The following embodiments are non-limiting examples and those working in this field should understand that various modifications can be applied to the examples described herein without departing from the scope of this disclosure.

The components described herein can be made of one or more of a number of suitable materials to allow the component or other associated components to meet certain standards and/or regulations. Examples of such materials can include, but are not limited to, aluminum, stainless steel, copper, fiberglass, plastic, PVC, ceramic, and rubber.

Components described herein can be made from multiple pieces that can be mechanically coupled to each other using one or more of a number of coupling methods, including but not limited to, epoxy, welding, soldering, fastening devices, compression fittings, mating threads, and slotted fittings. One or more pieces that are mechanically coupled to each other can be coupled to each other in one or more of a number of ways, including but not limited to fixedly, hingedly, removeably, slidably, and threadably. An attachment or coupling feature can include, but is not limited to, a swage, a snap, a clamp, a portion of a hinge, an aperture, a recessed area, a protrusion, a slot, a spring clip, a tab, a detent, a compression fitting, and mating threads.

Any component described in one or more figures herein can apply to any other figures having the same label. In other words, the description for any component of a figure can be considered substantially the same as the corresponding component described with respect to another figure unless otherwise noted. For any figure shown and described herein, one or more of the components may be omitted, added, repeated, and/or substituted. Accordingly, embodiments shown in a particular figure should not be considered limited to the specific arrangements of components shown in such figure.

Referring to FIG. 1, a cross-sectional illustration is shown of separate flow sensor 105 and diffuser 110 components joined with a coupler 115 as known in the prior art. As described above in the Background Section, the separate flow sensor 105 and diffuser 110 components have drawbacks due to their length and difficulty with installing the diffuser at the optimal position for thermal efficiency. For example, the flow sensor and diffuser would typically be attached to a water heater fitting located on a top surface of a cylindrically shaped gas water heater so that the diffuser extends down into the water heater tank. Installation requires first attaching the diffuser 110 and coupler 115 to the water heater with a first application of torque. When the diffuser is attached to the water heater, it can be disposed at a particular position, such as 2 o'clock for the diffuser outlet 112, that affects the circulation of the incoming water to optimize thermal efficiency. Second, the flow sensor 105 is attached to the coupler 115 with a second application of torque. When attaching the flow sensor 105 to the coupler 115, the second application of torque can cause the diffuser to be rotated from its optimal position.

In contrast, FIG. 2 is a cross-sectional illustration of an inlet fitting that is a combined flow sensor and diffuser assembly 200 in accordance with an example embodiment of this disclosure. In the example assembly of FIG. 2, the flow sensor body 205 includes an integral attachment mechanism 206 and an extending cylindrical flange 207 that extends from the integral attachment mechanism 206 and outward away from the flow sensor body 205. The diffuser 210 attaches to the flow sensor body 205 with a complementary attachment mechanism 214 that is integral to the diffuser so that the flow sensor and diffuser assembly 200 forms a single component and can be installed as a single component in a water heater. As shown in FIG. 2, the attachment mechanism 206 can be a protrusion and the complementary attachment mechanism 214 can be a notch. In alternate embodiments, the protrusion and notch can be reversed or can be any other readily know attachment mechanism such as a swage fitting.

The combined flow sensor and diffuser assembly 200 can have a single set of threads on the outer surface of the extended cylindrical flange 207 so that the combined flow sensor and diffuser assembly 200 can be attached to the water heater as a single assembly. Because only one tightening procedure is required to attach the single flow sensor and diffuser assembly 200, the installer is better able to ensure that the diffuser 210 is in the correct orientation to optimize the flow of the cold inlet water entering the water heater from the diffuser outlet 212. The combined flow sensor and diffuser assembly 200 also comprises an inlet 202 that is configured to couple to a water supply pipe.

The single flow sensor and diffuser assembly 200 is also an improvement over the prior art components shown in FIG. 1 because it has a shorter length thereby allowing for installation in smaller spaces. Referring to the non-limiting prior art example shown in FIG. 1, the joined flow sensor 105, diffuser 110, and coupler 115 have a combined length ranging from 10.25 to 10.50 inches. In contrast, the example combined flow sensor and diffuser assembly 200 of FIG. 2 has a length of 7.25 inches thereby making it easier to install in small spaces. In other examples, the length of the combined flow sensor and diffuser assembly can vary within a range of 5 to 8 inches. All dimensions shown in the figures herein are in inches and should be considered non-limiting examples of the embodiments described herein.

Figure 4:
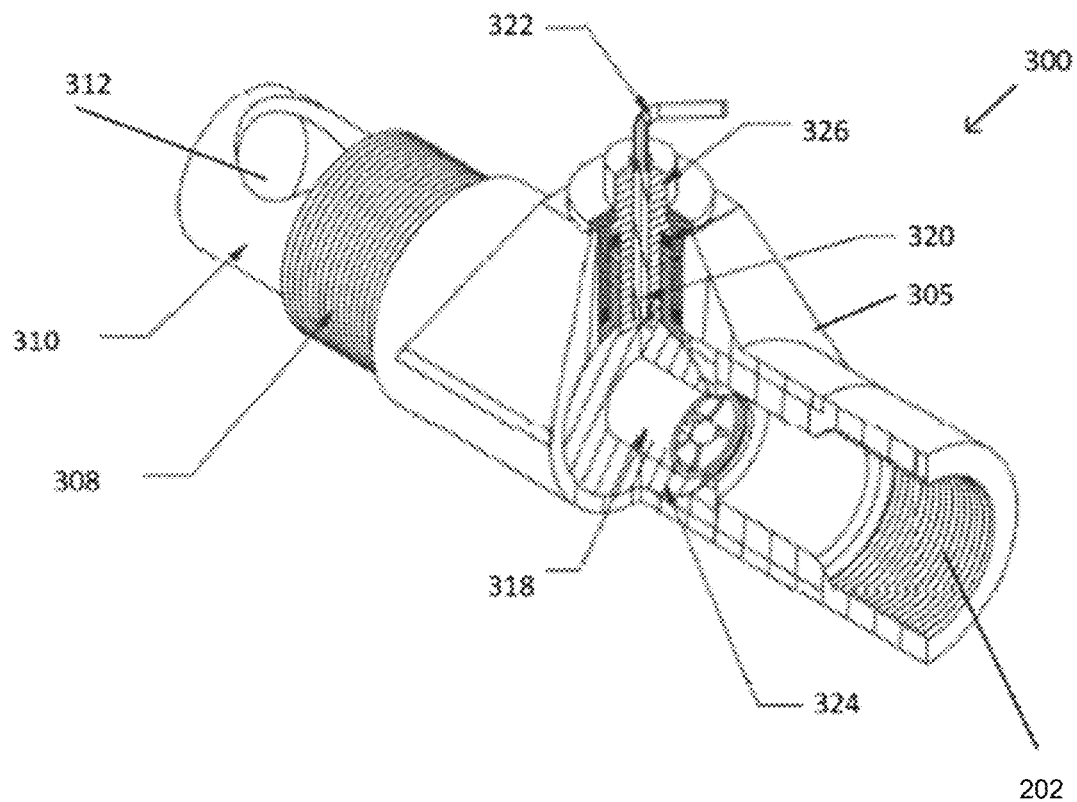
FIG. 4 is a perspective, partial cross-sectional illustration of an inlet fitting that is a combined flow sensor, diffuser, and shut off valve assembly in accordance with an example embodiment of this disclosure.

FIGS. 3 and 4 illustrate a cross-sectional view and a perspective, partial cross-sectional view, respectively, of an inlet fitting 300 that is a combined flow sensor, diffuser, and shut off valve assembly in accordance with an example embodiment of this disclosure. Similar to the embodiment shown in FIG. 2, the embodiment shown in FIGS. 3 and 4 includes a diffuser 310 with a complementary attachment mechanism 314, and the flow sensor body 305 with an extending cylindrical flange 307 and an attachment mechanism 306. The attachment mechanism 306 and complementary attachment mechanism 314 can comprise a protrusion and a notch that lock together as shown in FIG. 3 or can comprising other known attachment mechanisms. The flow sensor body 305 shown in FIGS. 3 and 4 can also include male threads 308 on the outer surface of the extending cylindrical flange 307 for mating with a female fitting on the water tank.

The example embodiment shown in FIGS. 3 and 4 is similar to the embodiment shown in FIG. 2, except that it shows more details of the flow sensor and shows a shut off valve in the form of a ball valve that is integrated with the flow sensor. While the diffuser 310 is shown in FIGS. 3 and 4, it should be understood that the combined flow sensor and shut off valve can be used without the diffuser 310 in certain example embodiments. The combined flow sensor and shut off valve shown in FIGS. 3 and 4 provides advantages over the prior art in that the components are integrated into a single assembly thereby simplifying installation and reducing the space required when a shut off valve and flow sensor are separate components.

In the embodiment shown in FIGS. 3 and 4, the flow sensor comprises a turbine 318 a Hall effect sensor 320 and a sensor lead 322. The turbine 318 is positioned inside the ball 324 of the ball valve and the Hall effect sensor 320 and the sensor lead 322 are located in the stem 326 of the ball valve. The flow sensor measures the flow of water through the inlet fitting 300 and, in conjunction with the Hall effect sensor 320, provides a signal via the sensor lead 322 to a meter that gathers data indicating the flow of water into the water heater. In alternate embodiments, other types of flow sensors can be implemented in the valve. A motor, not shown in FIGS. 3 and 4, can control the opening and closing of the ball valve via the stem 326. Placing a shut off valve at the entrance to the water heater provides advantages that include controlling the flow of water at the entrance to the water heater and being able to maintain a vacuum seal within the water heater.

Figure 5:
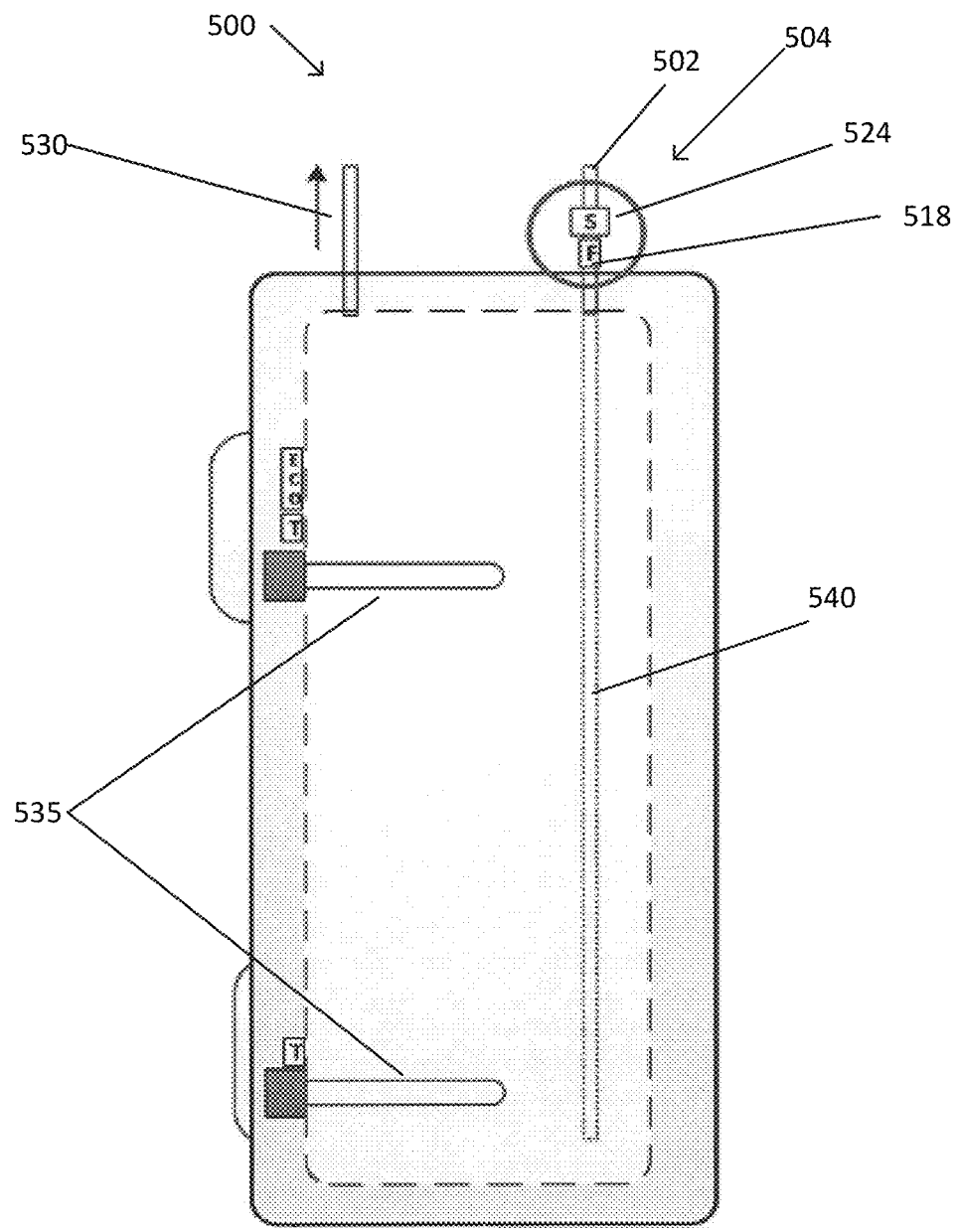
FIG. 5 is a schematic illustration of an electric water heater with a shut off valve and flow sensor located at the inlet in accordance with an example embodiment of this disclosure.

Referring now to FIGS. 5-10, another example embodiment of an integrated inlet fitting, flow sensor and shut off valve is illustrated. The embodiment illustrated in FIGS. 5-10 is in connection with an electric water heater, however, the same concepts can also be applied to a gas water heater. FIG. 5 shows a schematic illustration of an electric water heater 500 with an inlet 502, an outlet 530, and two heating elements 535. An inlet fitting 504 comprises an integrated shut off valve 524 and flow sensor 518 in accordance with an example embodiment of this disclosure. In contrast to the previously described fittings for gas water heaters that included an optional diffuser, the electric water heater 500 shown in FIG. 5 includes an optional dip tube 540 attached to the inlet fitting 504.

Figure 10:
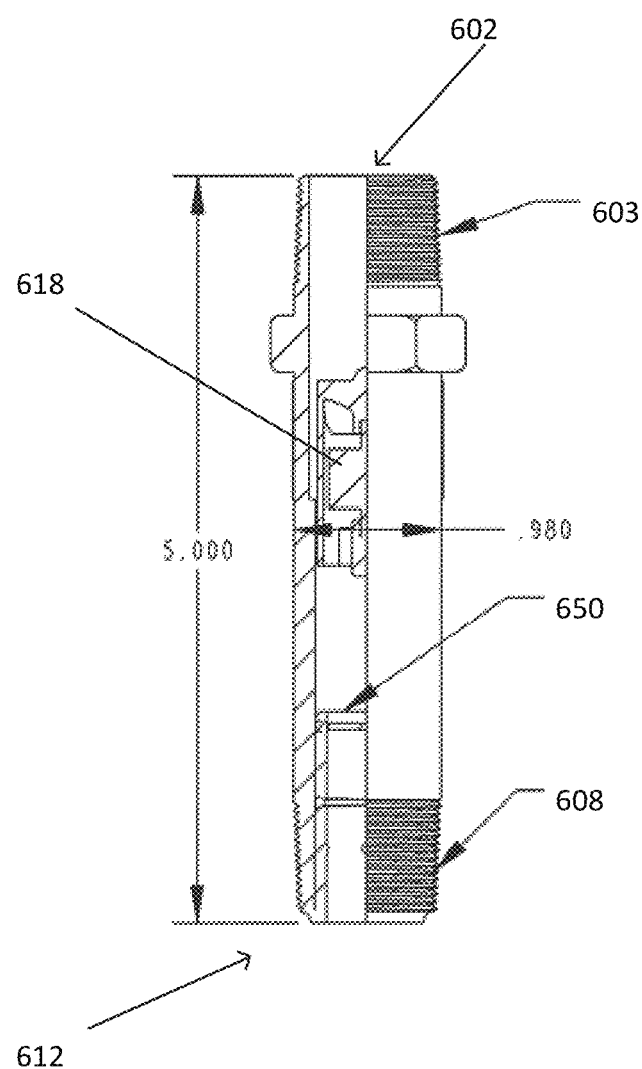
FIG. 10 is a partial cross section of the inlet fitting of FIGS. 6-9 that is a combined flow sensor and shut off valve showing a heat trap insert in accordance with an example embodiment of this disclosure.

FIGS. 6-10 show different views of an example inlet fitting 604 comprising an integrated flow sensor and shut off valve in accordance with the embodiment shown in FIG. 5. FIG. 6 is a top view of the fitting, FIG. 7 is a top perspective view of the fitting, FIG. 8 is a back view of the fitting, and FIG. 9 is a side view of the fitting. FIG. 10 is a partial cross-sectional view of the fitting showing the flow sensor integrated into the shut off valve, but that omits, for purposes of clarity, the external components of the fitting shown in FIGS. 6-9. While the example shown in FIGS. 6-10 is an inlet fitting, it should be understood that the same components can also be implemented in an outlet fitting for a water heater.

FIGS. 6-10 show the inlet fitting 604 with an inlet 602, inlet threads 603, an outlet 612, and outlet threads 608. The outlet threads 608 permit the inlet fitting 604 to be attached to a fitting on the water heater. The inlet threads 603 permit the inlet fitting 604 to be attached to a water supply pipe.

As shown in FIGS. 6-10, the integrated inlet fitting 604 combines a flow sensor and shut off valve into a single assembly that simplifies installation. The integrated inlet fitting also requires less space than if one were to install a separate flow sensor and a separate shut off valve at a water heater inlet. FIGS. 6-9 show the shut off valve 624 located inside the inlet fitting 604 and an electronic actuator 645 connected to the inlet fitting via a valve stem 626. The electronic actuator 645 can be connected to a separate controller and/or power source via lead 623 and the electronic actuator 645 controls the opening and closing of the shut off valve 624. The shut off valve 624 can be a ball valve similar to the valve described in connection with FIGS. 3 and 4, or another type of valve. Located within the shut off valve is a turbine 618 for measuring the flow of water through the inlet fitting 604. The turbine 618 works with a Hall effect sensor 620, located on the outer surface of the inlet fitting 604, to provide signals to a meter, via lead 622, indicating the flow of water through the inlet fitting 604. The integrated inlet fitting can also include a heat trap 650 located inside the inlet fitting and downstream of the shut off valve 624. The heat trap 650 is a valve that prevents the heated water within the water tank from flowing back through the inlet fitting and mixing with the cold water from the water supply.

While example embodiments of integrated inlet fittings are discussed herein, the principles of the described embodiments can be applied to a variety of types of water heaters. Accordingly, many modifications of the embodiments set forth herein will come to mind to one skilled in the art having the benefit of the teachings presented in the foregoing descriptions and the associated drawings. Therefore, it is to be understood that water inlet structures, flow sensors, shut off valves, and diffusers are not to be limited to the specific embodiments disclosed and that modifications and other embodiments are intended to be included within the scope of this application. Although specific terms are employed herein, they are used in a generic and descriptive sense only and not for purposes of limitation.

What is claimed is:

1. An integrated flow sensor and diffuser mechanism for a water heater comprising:
   a flow sensor body configured to house a flow sensor, the flow sensor body comprising:
      an inlet having an aperture and a first threaded attachment mechanism on the inside of the inlet for attaching the integrated flow sensor and diffuser mechanism to a water supply pipe; and
      an extended cylindrical flange which comprises a diffuser attachment mechanism having (1) a notch along an inner surface of the extended cylindrical flange and (2) a second threaded attachment mechanism on an outer surface of the extended cylindrical flange, the second threaded attachment mechanism configured to attach the integrated flow sensor and diffuser mechanism to a water heater fitting; and
   a diffuser fixedly attached to the flow sensor body, the diffuser comprising:
      a complementary diffuser attachment mechanism having a protrusion, wherein the notch of the diffuser attachment mechanism is configured to receive the protrusion of the complementary diffuser attachment mechanism to fixedly couple the diffuser to the extended cylindrical flange, and
      an outlet configured to direct a flow of fluid outwardly from the diffuser at an angle relative to the inlet.

2. The integrated flow sensor and diffuser mechanism of claim 1, wherein the flow sensor body comprises a cavity for retaining the flow sensor.

3. The integrated flow sensor and diffuser mechanism of claim 1, wherein a length of the integrated flow sensor and diffuser mechanism is between 5 inches and 8 inches when the diffuser is coupled to the flow sensor body.

4. The integrated flow sensor and diffuser mechanism of claim 1, wherein the outlet of the diffuser comprises an aperture located on a side wall of the diffuser.

5. The integrated flow sensor and diffuser mechanism of claim 1 further comprising:
   a shut off valve configured to be transitioned between an open position and a closed position, wherein when the shut off valve is in the open position, the shut off valve is configured to permit the fluid to flow through the integrated flow sensor and diffuser mechanism, and wherein when the shut off valve is in the closed position, the shut off valve is configured to prevent the fluid from flowing through the integrated flow sensor and diffuser mechanism.

6. The integrated flow sensor and diffuser mechanism of claim 5, wherein the shut off valve comprises a ball valve, and wherein the flow sensor is positioned within a ball of the ball valve.

7. The integrated flow sensor and diffuser mechanism of claim 5 further comprising an electronic actuator configured to transition the shut off valve between the open and the closed position.

* * * * *